United States Patent
Lee et al.

(10) Patent No.: US 11,497,116 B2
(45) Date of Patent: Nov. 8, 2022

(54) FLEXIBLE CIRCUIT BOARD AND ELECTRONIC DEVICE COMPRISING SAME

(71) Applicant: STEMCO CO., LTD., Cheongju-si (KR)

(72) Inventors: Jin Han Lee, Cheongju-si (KR); Sung Bin Park, Cheongju-si (KR); Hiroo Shimizu, Cheongju-si (KR); Dong Eun Son, Daejeon (KR)

(73) Assignee: STEMCO CO., LTD., Cheongju-si (KR)

( * ) Notice: Subject to any disclaimer, the term of this patent is extended or adjusted under 35 U.S.C. 154(b) by 0 days.

(21) Appl. No.: 16/990,341

(22) Filed: Aug. 11, 2020

(65) Prior Publication Data

US 2020/0375028 A1 Nov. 26, 2020

Related U.S. Application Data

(63) Continuation of application No. PCT/KR2019/000072, filed on Jan. 3, 2019.

(30) Foreign Application Priority Data

Feb. 14, 2018 (KR) ........................ 10-2018-0018797

(51) Int. Cl.
H05K 1/02 (2006.01)
H05K 1/11 (2006.01)
(Continued)

(52) U.S. Cl.
CPC ........... *H05K 1/0298* (2013.01); *H05K 1/112* (2013.01); *H05K 1/115* (2013.01); *H05K 1/181* (2013.01);
(Continued)

(58) Field of Classification Search
CPC ...... H05K 1/0298; H05K 1/112; H05K 1/115; H05K 1/181; H05K 2201/10128;
(Continued)

(56) References Cited

U.S. PATENT DOCUMENTS 9,280,182 B2 3/2016 Ha et al.
9,437,526 B2 9/2016 Lim et al.
(Continued)

FOREIGN PATENT DOCUMENTS

KR 2011057650 A * 6/2011
KR 10-2014-0108845 A 9/2014
(Continued)

OTHER PUBLICATIONS

Office Action issued in KR 10-2018-0018797; mailed by the Korean Intellectual Property Office dated Jan. 26, 2020.
(Continued)

*Primary Examiner* — Ishwarbhai B Patel
(74) *Attorney, Agent, or Firm* — Studebaker & Brackett PC

(57) ABSTRACT

A flexible circuit board is provided. The flexible circuit board includes a base film with an outer lead region defined on either one surface or the other surface and an outer lead provided in the outer lead region and connected to an electronic device, in which the outer lead includes a plurality of first outer leads and a plurality of second outer leads formed to be spaced apart from each other so as to face each other in the outer lead region, and in which the number of the plurality of first outer leads is greater than the number of the plurality of second outer leads.

14 Claims, 4 Drawing Sheets

(51) Int. Cl.
　　　*H05K 1/18*　　　(2006.01)
　　　*H05K 1/14*　　　(2006.01)
(52) U.S. Cl.
　　　CPC .............. *H05K 1/111* (2013.01); *H05K 1/114* (2013.01); *H05K 1/147* (2013.01); *H05K 1/189* (2013.01); *H05K 2201/10128* (2013.01)
(58) Field of Classification Search
　　　CPC ......... H05K 2201/09445; H05K 1/189; H05K 1/114; H05K 1/147; H05K 1/111; G02F 1/136254; G02F 1/13458
　　　See application file for complete search history.

(56) References Cited

U.S. PATENT DOCUMENTS

| | | | | |
|---|---|---|---|---|
| 2002/0050406 | A1* | 5/2002 | Yamashita | .............. H01L 22/32 174/260 |
| 2010/0295045 | A1* | 11/2010 | Yoshino | ................ H01L 23/544 257/48 |
| 2013/0186680 | A1* | 7/2013 | Ha | .......................... H01L 24/50 205/291 |
| 2014/0246687 | A1 | 9/2014 | Ha et al. | |
| 2014/0327148 | A1 | 11/2014 | Lim et al. | |
| 2016/0197020 | A1* | 7/2016 | Lim | ........................ H01L 23/66 257/48 |
| 2016/0218053 | A1* | 7/2016 | Cho | .................... G02F 1/13452 |

FOREIGN PATENT DOCUMENTS

| | | |
|---|---|---|
| KR | 10-2014-0131813 A | 11/2014 |
| KR | 10-2016-0091595 A | 8/2016 |
| KR | 10-2017-0036942 A | 4/2017 |
| KR | 10-2017-0066762 A | 6/2017 |

OTHER PUBLICATIONS

International Search Report issued in PCT/KR2019/000072; dated Apr. 11, 2019.

An Office Action; "Notice of Reasons for Refusal", mailed by the Japanese Patent Office dated May 24, 2022, which corresponds to Japanese Patent Application No. 2020-565243 and is related to U.S. Appl. No. 16/990,341; with English language translation.

* cited by examiner

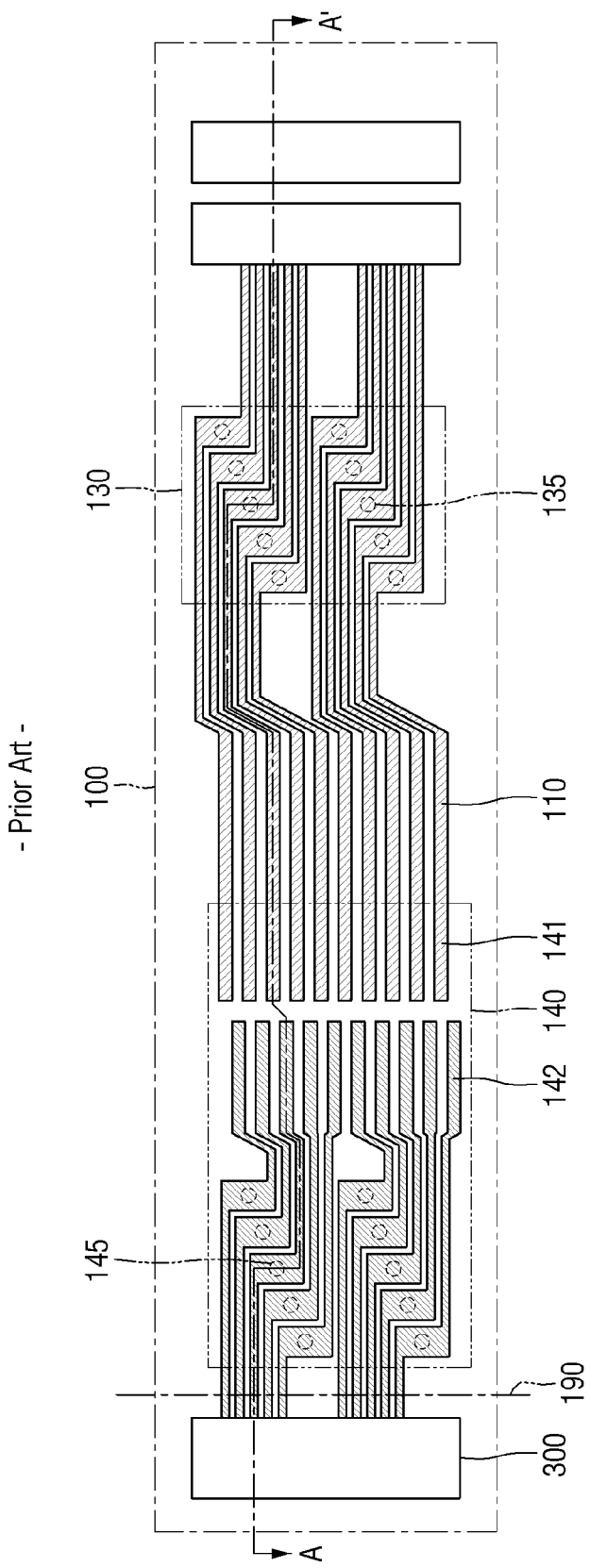
[FIG. 1]
- Prior Art -

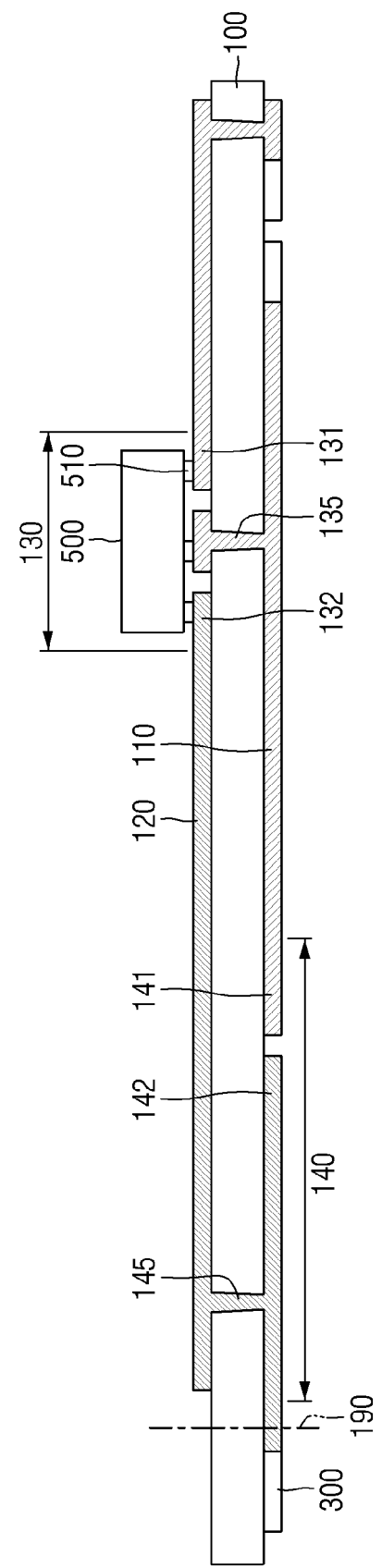
[FIG. 2]
- Prior Art -

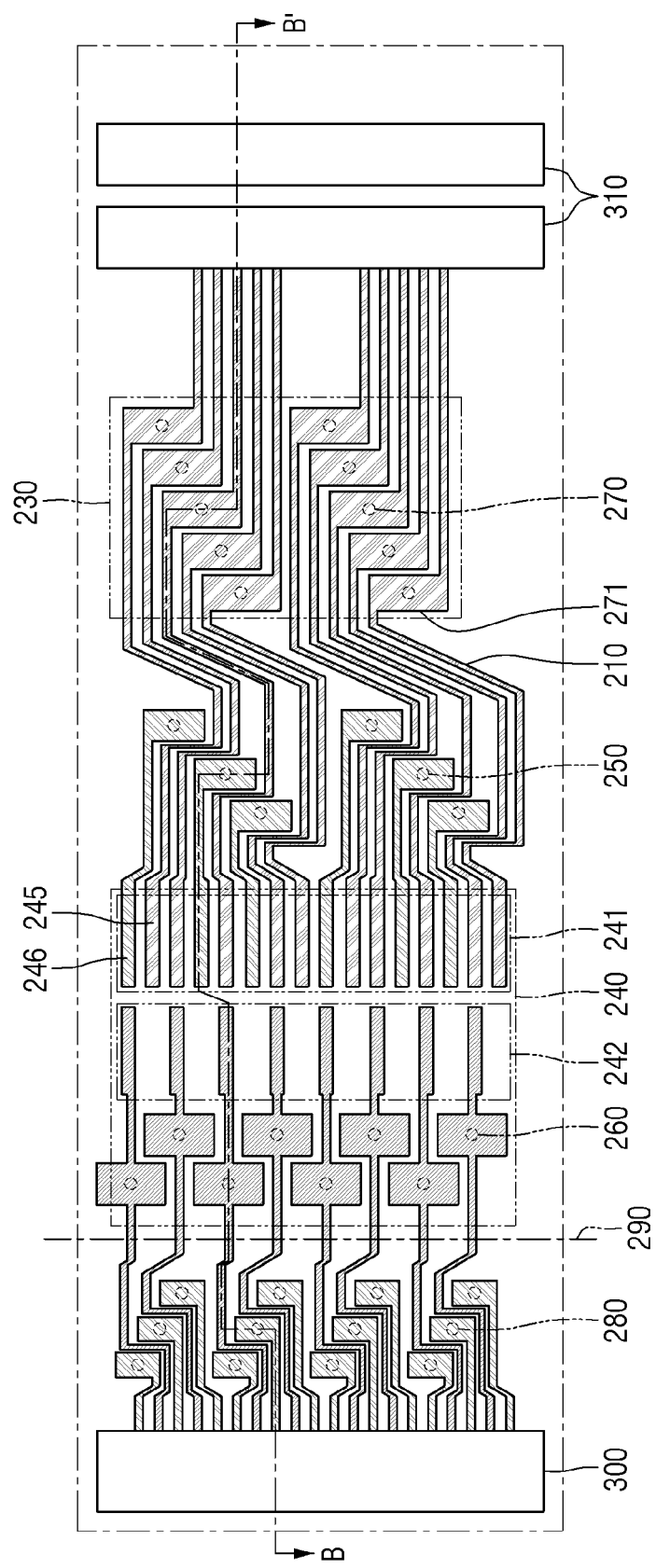
[FIG. 3]

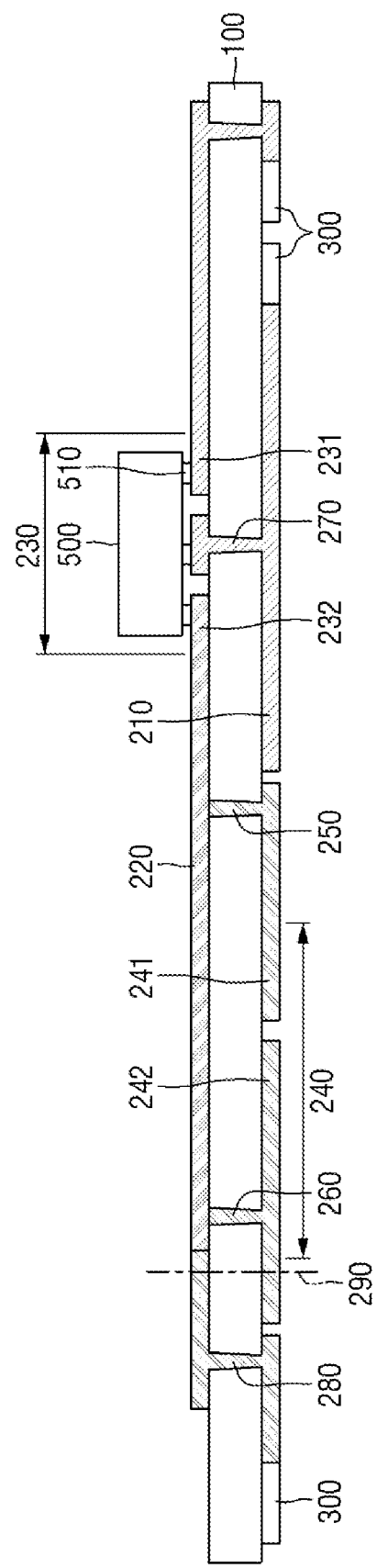
[FIG. 4]

FLEXIBLE CIRCUIT BOARD AND ELECTRONIC DEVICE COMPRISING SAME

CROSS-REFERENCE TO RELATED APPLICATION

The present application is a continuation of International Patent Application No. PCT/KR2019/000072, filed Jan. 3, 2019, which is based upon and claims the benefit of priority to Korean Patent Application No. 10-2018-00018797, filed on Feb. 14, 2018. The disclosures of the above-listed applications are hereby incorporated by reference herein in their entirety.

BACKGROUND

1. Technical Field

The present invention relates to a flexible circuit board and an electronic device comprising the same.

2. Description of the Related Art

Recently, according to the trend of miniaturization of electronic devices, a chip on film (COF) package technology using a flexible circuit board has been used. The flexible circuit board and the COF package technology using the same are used in a flat panel display (FPD), such as a liquid crystal display (LCD), an organic light emitting diode display device, or the like.

The flexible circuit board using the COF package technology may include a base film included as a substrate, a conductive wiring pattern formed on the base film, at least one plating layer formed on the wiring pattern, and a protective layer covering the wiring pattern on which the plating layer is formed.

FIGS. 1 to 2 are views for explaining a flexible circuit board according to the related art. FIG. 1 is a bottom view of the flexible circuit board in the related art, and FIG. 2 is a cross-sectional view of FIG. 1 taken along line A-A'.

Referring to FIGS. 1 and 2, the flexible circuit board according to the related art includes a base film 100 in which an inner lead region 130 and an outer lead region 140 are defined, a first wiring pattern 110, a second wiring pattern 120, a first via 135 and a second via 145 connecting the first wiring pattern 110 and the second wiring pattern 120, or the like.

An element 500 connected to inner leads 131 and 132 is mounted on the inner lead region 130. An external device connected to the flexible circuit board, for example, a flat panel display, may be connected to outer leads 141 and 142 in the outer lead region 140.

The second via 145 is connected to a via pad on one surface of the base film 100. As shown in FIG. 1, the via pad has a shape in which a width of the first wiring via pattern 110 is expanded. Therefore, the plurality of via pads may be arranged on the outer lead region 140 in a constant direction, and may be arranged side by side in a diagonal direction as an example.

In the outer lead region 140 where the flexible circuit board and the flat panel display are bonded, a region where the via pads are arranged corresponds to a bezel region of the flat panel display. Therefore, as in FIG. 1, as the via pads occupy a larger area in the outer lead region 140, it may have difficulty in reducing an area of a bezel of the flat panel display.

SUMMARY

Aspects of the present invention provide a flexible circuit board having a reduced area of an outer lead region by varying the arrangement of vias formed on a base film.

However, aspects of the present invention are not restricted to those set forth herein. The above and other aspects of the present invention will become more apparent to one of ordinary skill in the art to which the present invention pertains by referencing the detailed description of the present invention given below.

A flexible circuit board according to some embodiments of the present invention may include a base film with an outer lead region defined on either one surface or the other surface and an outer lead provided in the outer lead region and connected to an electronic device, in which the outer lead may include a plurality of first outer leads and a plurality of second outer leads formed to be spaced apart from each other so as to face each other in the outer lead region, and in which the number of the plurality of first outer leads may be greater than the number of the plurality of second outer leads.

In some embodiments of the present invention, it may further include a first wiring pattern formed on one surface of the base film, a second wiring pattern formed on the other surface of the base film, and an n-via penetrating the base film and electrically connecting the first wiring pattern and the second wiring pattern (n is a natural number).

In some embodiments of the present invention, an inner lead region is defined on either of the one surface and the other surface of the base film, and it may further include an inner lead connected to an element in the inner lead region.

In some embodiments of the present invention, at least one of the n-via may be arranged between the inner lead region and the outer lead region.

In some embodiments of the present invention, it may further include a second via electrically connecting the second outer lead and the second wiring pattern and penetrating the base film.

In some embodiments of the present invention, at least one or more of the plurality of first outer leads may be electrically connected to the second wiring pattern through the first via, and the first outer lead that is not electrically connected to the first via among the plurality of first outer leads may extend from the outer lead region to the inner lead region.

In some embodiments of the present invention, the second via may be arranged in the outer lead region.

In some embodiments of the present invention, it may further include a third via electrically connecting the first wiring pattern and the second wiring pattern included in the inner lead region, and penetrating the base film.

In some embodiments of the present invention, it may further include a test pad formed on the base film, in which the test pad may be formed between a cut line defined in the base film to be cut after completion between the outer lead region and an end of the base film, and the end of the base film, and in which the second wiring pattern may be connected to the test pad through a fourth via penetrating the base film.

In some embodiments of the present invention, the number of the plurality of first outer leads may exceed and be 10 times or less than the number of the plurality of second outer leads.

A flexible circuit board according to some embodiments of the present invention includes: a base film with an outer lead region defined on either one surface or the other surface; a first wiring pattern formed on the one surface; a second wiring pattern formed on the other surface; a first via and a second via penetrating the base film, and electrically connecting the first wiring pattern and the second wiring pattern, respectively; and an outer lead formed in the outer lead region and connected to an external device, in which the outer lead includes a plurality of first outer leads and a plurality of second outer leads spaced from each other so as to face each other in the outer lead region, in which at least some of the plurality of first outer leads are electrically connected to the second wiring pattern through the first via, in which the remaining of the plurality of first outer leads extend from the first wiring pattern to the outer lead region, and in which the plurality of second outer leads are electrically connected to the second wiring pattern through the second via.

In some embodiments of the present invention, the number of the plurality of first outer leads may be greater than the number of the plurality of second outer leads.

An electronic device according to some embodiments of the present invention includes a flexible circuit board and an external device bonded to the flexible circuit board, in which the flexible circuit board includes: a base film including one surface and the other surface, in which an inner lead region is defined on either of the one surface and the other surface of the base film, and an outer lead region is defined on either of the one surface and the other surface; a first wiring pattern formed on the one surface; a second wiring pattern formed on the other surface; a via penetrating the base film and electrically connecting the first wiring pattern and the second wiring pattern; an outer lead formed in the outer lead region and connected to the external device; and an inner lead formed in the inner lead region and connected to an element, in which the outer lead includes a plurality of first outer leads and a plurality of second outer leads spaced from each other so as to face each other in the outer lead region, in which the number of plurality of the first outer leads is greater than the number of the plurality of second outer leads.

In some embodiments of the present invention, the external device may include a flat panel display.

In some embodiments of the present invention, it may further include a via electrically connecting the second outer lead and the second wiring pattern and arranged in the outer lead region.

In some embodiments of the present invention, the external device may include a flat panel display, and an area of an area in which the via is arranged in the outer lead region may be formed to correspond to an area of a bezel of the flat panel display.

In the flexible circuit board according to some embodiments of the present invention, a plurality of outer leads arranged in the outer lead region are respectively connected to the first via and the second via. Here, the number of the second vias arranged in the outer lead region is less than the number of the first outer leads formed on one surface of the outer lead region. Therefore, the benefit of reducing the area of the outer lead region and reducing the area of the bezel of the flat panel display connected to the flexible circuit board may be obtained.

BRIEF DESCRIPTION OF THE DRAWINGS

The above and other aspects and features of the present invention will become more apparent by describing in detail exemplary embodiments thereof with reference to the attached drawings, in which:

FIG. 1 is a bottom view showing one surface of a flexible circuit board according to the related art;

FIG. 2 is a cross-sectional view of FIG. 1 taken along line A-A';

FIG. 3 is a top view showing one surface of a flexible circuit board according to some embodiments of the present invention; and FIG. 4 is a cross-sectional view of FIG. 3 taken along line B-B'.

DETAILED DESCRIPTION OF THE EMBODIMENTS

Benefits and features of the present disclosure, and methods for accomplishing the same will become apparent with reference to embodiments described below in detail in conjunction with the accompanying drawings. However, the present invention is not limited to the embodiments disclosed below, but would be implemented in various forms. The present embodiments are merely provided to make the disclosure of the present invention complete and to fully inform the scope of the invention to those skilled in the art. The present invention is defined only by the scope of claims. Like reference numerals refer to like elements throughout the specification.

When it is mentioned that a component is "connected to" or "coupled to" another component, it includes a case where other components are directly connected or coupled or a case where other components are interposed. On the other hand, when it is mentioned that one component is "directly connected to" or "directly coupled to" another component, it indicates that there are no intervening components. "And/or" includes each and every combination of one or more of the items mentioned.

When it is mentioned that a component is "on" or "above" the other component, it includes a case where other component is interposed in the middle as well as directly above another component. On the other hand, when it is mentioned that a component is "directly on" or "directly above" another component, it indicates that there are no intervening components.

The spatially relative terms "below," "beneath," "lower," "above," "upper," or the like may be used to easily describe the correlation between one component and other components as shown in the drawings. The spatially relative terms should be understood as terms including different directions of an element in use or operation in addition to the directions shown in the drawings. For example, if an element shown in the drawings is turned over, components described as "below" or "beneath" of other elements may be placed "above" other components. Accordingly, an exemplary term "below" may include both the directions below and above. The component may also be oriented in different directions, so that the spatially relative terms may be interpreted according to the orientation.

The terms used herein are for the purpose of describing embodiments and are not intended to be limiting of the present invention. Herein, the singular also includes the plural unless specifically stated otherwise in the phrase. The terms "comprises" and/or "comprising" as used herein do not exclude the presence or addition of one or more other components, steps, operations, and/or elements mentioned.

Although the first, second, etc. are used to describe various components, it goes without saying that these components are not limited by these terms. These terms are only used to distinguish one component from another component. Therefore, it goes without saying that the first component mentioned below may be the second component within the technical spirit of the present invention.

Unless otherwise defined, all terms (including technical and scientific terms) used herein may be used in a sense that may be commonly understood by those of ordinary skill in the art. In addition, the terms defined in the commonly used dictionaries are not ideally or excessively interpreted unless they are specifically defined clearly.

Hereinafter, a flexible circuit board according to some exemplary embodiments of the present invention will be described with reference to FIGS. 3 to 4.

The flexible circuit board according to some embodiments of the present invention may include a base film 100, a first wiring pattern 210, a second wiring pattern 220, a first via 250, a second via 260, a third via 270, or the like.

The base film 100 has flexibility, for example, and may be included as a base material of the flexible circuit board. The base film 100 may include, for example, a polyimide film, a PET (Polyethylene Terephthalate) film, an insulating film such as a polyethylene naphthalate film or a polycarbonate film, or a metal foil such as an aluminum oxide foil. Hereinafter, the base film 100 will be described as an exemplary polyimide film.

The first wiring pattern 210 may be formed on one surface of the base film 100. The first wiring pattern 210 may transmit a signal by electrically connecting elements mounted on the base film 100 or external electronic devices connected by the flexible circuit board.

An inner lead region 230 and an outer lead region 240 may be defined on the base film 100. The inner lead region 230 is a region in which the element 500 mounted on the flexible circuit board is mounted. In the inner lead region 230, the element 500 may be bonded to inner leads 231 and 232 through a solder ball or bump 510 or the like.

Outer leads 241 and 242 electrically connected to the external electronic device may be arranged in the outer lead region 240.

FIGS. 3 and 4 illustrate that the inner lead region 230 and the outer lead region 240 are respectively defined on one surface and the other surface of the base film 100. However, the present invention is not limited thereto. The inner lead region 230 and the outer lead region 240 may be defined on the same surface of the base film 100. In other words, the inner leads 231 and 232 and the outer leads 241 and 242 may be arranged on the same surface of the base film 100.

The first wiring pattern 210 may include a conductive material, for example, copper, but the present invention is not limited thereto. Specifically, the first wiring pattern 210 may include a conductive material such as gold or aluminum. In the flexible circuit board according to some embodiments of the present invention, it is described that the first wiring pattern 210 includes copper.

The second wiring pattern 220 may also be formed to include the same material as the first wiring pattern 210.

The first wiring pattern 210 and the second wiring pattern 220 may be formed on both surfaces of the base film 100 as shown in FIGS. 3 and 4, respectively. In other words, when the first wiring pattern 210 is formed on one surface of the base film 100, the second wiring pattern 220 may be formed on the other surface of the base film 100. In addition, the wiring patterns may include via pads, which will be described later.

The first via 250, the second via 260, and the third via 270 may be formed to connect the first wiring pattern 210 and the second wiring pattern 220. The first via 250, the second via 260, and the third via 270 may be formed by filling a conductive material with a multi-layer structure of a single layer or two or more layers in a via penetrating the base film 100.

The first via 250 may be arranged between the inner lead region 230 and the outer lead region 240. Here, when it is mentioned that the first via 250 is arranged between the inner lead region 230 and the outer lead region 240, it means that the first via 250 is formed to penetrate the base film 100 between the inner lead region 230 and the outer lead region 240 defined on each opposite surface of the base film 100.

A first via pad may be formed on the first via 250 to connect the first via 250 and the first wiring pattern 210 or the second wiring pattern 220. The first via pad may be formed on one surface of the base film 100 in a shape in which a width of the first wiring pattern 210 is expanded.

The first via 250 and the first via pad may be arranged outside the outer lead region 240. Likewise, the first via 250 and the first via pad may be arranged outside the inner lead region 230.

The first via pad may be connected to a portion of the first outer lead 241 in the outer lead region 240. Therefore, the first via pad may electrically connect a portion of the first outer lead 241 and the second wiring pattern 220.

The inner leads 231 and 232 may be arranged in the inner lead region 230. The inner leads 231 and 232 may be connected to the element 500 through the solder ball or bump 510 or the like.

A third via pad 233 may be further formed on the third via 270. The third via pad 233 may be connected to the second wiring pattern, and may be formed on one surface of the base film 100 in an expanded shape of the second wiring pattern 220.

The inner leads 231 and 232 may be connected to the second wiring pattern 220. In addition, the inner leads 231 and 232 may be connected to the first wiring pattern 210 through the third via 270.

The inner leads 231 and 232 may include a first inner lead 231 and a second inner lead 232. The first inner lead 231 and the second inner lead 232 may be arranged to face to each other on both sides of the inner lead region 230.

The inner leads 231 and 232 may have a shape in which the first wiring pattern 210 is extended. While he first wiring pattern 210 or the second wiring pattern 220 is protected with an insulator such as a solder resist, the inner leads 231 and 232 may have a form exposed to the outside without being covered with an insulator for connection with the element 500.

The Inner leads 231 and 232 may include at least one plating layer to protect conductors forming the inner leads 231 and 232 and to improve the bonding ability with the element 500.

The outer leads 241 and 242 may be formed in the outer lead region 240. A plurality of first outer leads 241 and a plurality of second outer leads 242 may be arranged in the outer lead region 240 to face each other. In other words, the plurality of first outer leads 241 may be arranged on one side of the outer lead region 240, and the plurality of second outer leads 242 may be arranged on the other side of the outer lead region 240.

The plurality of first outer leads 241 and the plurality of second outer leads 242 may be spaced apart from each other without being connected so as to face each other in the outer lead region 240.

As shown in FIGS. 3 and 4, the plurality of first outer leads 241 may be arranged closer to the inner lead region 230 defined in the base film 100 than the plurality of second outer leads 242. The configuration of the plurality of first outer leads 241 and the plurality of second outer leads 242 will be described in more detail later.

Like the inner leads 231 and 232, the outer leads 241 and 242 may have a shape exposed outside without being covered by an insulator. The outer leads 241 and 242 may include at least one plating layer to protect conductors forming the outer leads 241 and 242 and to improve the bonding ability with an electronic device that is bonded to them.

A cutting line 290 may be defined in the base film 100. Based on the cutting line 290, the inner lead region 230 and the outer lead region 240 may be arranged on one side of the base film 100, and a fourth via 280 and a test pad 300 may be arranged on the other side of the base film 100. The cutting line 290 may be positioned between an end of the base film 100 and the outer lead region 240.

The cutting line 290 is a line that is cut after the manufacturing of the flexible circuit board is completed. A portion of the base film 100 on one side of the cutting line 290 on which the fourth via 280 and the test pad 300 are formed may be cut and discarded after the manufacturing of the flexible circuit board is completed.

The test pad 300 is a pad for applying a test signal to check whether the flexible circuit board of the present invention is operating normally. Similar to the test pad 300, a test pad 310 may be further formed on the base film 100. The test pad 310 may be electrically connected to the inner leads 231 and 232 through the third via 270.

The test pad 300 may be arranged between the end of the base film 100 and the cutting line 290.

The plurality of first outer leads 241 and the plurality of second outer leads 242 may have different numbers. In some embodiments of the present invention, the number of the plurality of first outer leads 241 may be greater than the number of the plurality of second outer leads 242. FIG. 3 shows that 16 first outer leads 241 and 8 second outer leads 242 are arranged. However, it is exemplary and the present invention is not limited thereto. The number of the plurality of first outer leads 241 may exceed and be 10 times or less than the number of the plurality of second outer leads 242. Preferably, the number of the plurality of first outer leads 241 may be formed to be 1.2 times or more and 5 times or less of the plurality of second outer leads 242.

In other words, the number of outer leads arranged on one side of the outer lead region 240 exceeds the number of outer leads arranged on the other side, and may be 10 times or less, and preferably 1.2 times to 5 times.

The plurality of first outer leads 241 may be classified into two types. At least one or more outer leads 246 of the plurality of first outer leads 241 are outer leads connected to the second wiring pattern 220 through the first via 250. In other words, the outer leads 246 may be electrically connected to the second wiring pattern 220.

The remaining outer leads 245 not connected to the first via 250 among the plurality of first outer leads 241 are outer leads connected to the first wiring pattern 210. In other words, the outer leads 245 are outer leads formed by extending the first wiring pattern 210 to the outer lead region 240. Therefore, the outer leads 246 may be electrically connected to the first wiring pattern 210.

Meanwhile, the plurality of second outer leads 242 may all be connected to the second via 260. Since the second via 260 is connected to the second wiring pattern 220, the second outer lead 242 may be electrically connected to the second wiring pattern 220.

In other words, in the case of the flexible circuit board according to the related art described with reference to FIGS. 1 and 2, the arrangement of the outer leads 142 connected through the second wiring pattern 120 and the second via 145 is limited to positions facing to the outer leads 141 connected to the first wiring pattern 110. Accordingly, the outer leads 141 are arranged on one side of the outer lead region 140, and the outer leads 142 are arranged on the other side of the outer lead region 140.

When the outer leads 141, 142 are arranged as in the related art, a size of the outer lead region 140 increases as the second via 145 and the via pads connected to the outer lead 142 are arranged in the outer lead region 140. The outer lead region 140 increased due to the second via 145 and the via pads corresponds to a region of a bezel of a flat panel display connected to the flexible circuit board, and is a factor that prevents a decrease in the area of the bezel.

On the other hand, in the flexible circuit board according to the embodiment of the present invention, the outer lead 245 connected to first wiring pattern 210 among first outer leads 241 arranged on one side of the outer lead region 240, and the outer lead 246 connected to the second wiring pattern 220 through the first via 250 may be mixed.

In other words, the outer leads connected to the second wiring patterns 220 are not all arranged on one side of the outer lead region 240, but are distributed and arranged on both sides of the outer lead region 240. In addition, only the second via 260 and the second via pads 261 corresponding to some of the vias connecting the second wiring pattern 220 and the outer leads 242 and 246, respectively, may be arranged within the outer lead regions 240, thereby reducing a size of the outer lead region 240 by that amount. Accordingly, a size of the bezel of the flat panel display bonded to the outer lead region 240 may also be reduced.

The embodiments of the present invention have been described with reference to the accompanying drawings. However, it may be understood that the present invention is not limited to the embodiments, but may be manufactured in various different forms, and may be implemented in other specific forms without changing the technical spirit or essential features of the present invention by those skilled in the art to which the present invention pertains. Therefore, it should be understood that the embodiments described above are exemplary in all respects and not restrictive.

The present invention may be applied to a flexible circuit board and an electronic device using the same.

What is claimed is:

1. A flexible circuit board, comprising:
   a base film with an outer lead region defined on either one surface or the other surface; and
   an outer lead provided in the outer lead region and connected to an electronic device,
   wherein the outer lead comprises a plurality of first outer leads and a plurality of second outer leads formed to be spaced apart from each other so as to face each other in the outer lead region,
   wherein the number of the plurality of first outer leads is greater than the number of the plurality of second outer leads,
   wherein the plurality of the first outer leads are arranged closer to an inner lead region defined in the base film than the plurality of the second outer leads, and
   wherein the plurality of first outer leads comprises:
   third outer leads, which are electrically connected to a first wiring pattern that is formed on one surface of the base film; and
   fourth outer leads, which are electrically connected to a second wiring pattern that is formed on the other surface of the base film.

2. The flexible circuit board of claim 1, further comprising:
an n-via penetrating the base film and electrically connecting the first wiring pattern and the second wiring pattern (n is a natural number).

3. The flexible circuit board of claim 2, wherein at least one of the n-via is arranged between the inner lead region and the outer lead region.

4. The flexible circuit board of claim 2, further comprising:
a second via electrically connecting the second outer lead and the second wiring pattern and penetrating the base film.

5. The flexible circuit board of claim 2, wherein at least one or more of the plurality of first outer leads are electrically connected to the second wiring pattern through a first via, and
wherein the first outer lead that is not electrically connected to the first via among the plurality of first outer leads extends from the outer lead region to the inner lead region.

6. The flexible circuit board of claim 5, wherein a second via is arranged in the outer lead region.

7. The flexible circuit board of claim 1, wherein the inner lead region is defined on one of the one surface and the other surface of the base film, which is a different surface from the surface where the outer lead region is defined, and
wherein the flexible circuit board further comprises an inner lead connected to an element in the inner lead region.

8. The flexible circuit board of claim 7, further comprising:
a third via electrically connecting the first wiring pattern and the second wiring pattern included in the inner lead region, and penetrating the base film.

9. The flexible circuit board of claim 1, further comprising:
a test pad formed on the base film,
wherein the test pad is formed between a cut line defined in the base film to be cut after completion between the outer lead region and an end of the base film, and the end of the base film, and
wherein the second wiring pattern is connected to the test pad through a fourth via penetrating the base film.

10. The flexible circuit board of claim 1, wherein the number of the plurality of first outer leads exceeds and is 10 times or less than the number of the plurality of second outer leads.

11. A flexible circuit board, comprising:
a base film with an outer lead region defined on either one surface or the other surface;
a first wiring pattern formed on the one surface;
a second wiring pattern formed on the other surface;
a first via and a second via penetrating the base film, and electrically connecting the first wiring pattern and the second wiring pattern, respectively; and
an outer lead formed in the outer lead region and connected to an external device,
wherein the outer lead comprises a plurality of first outer leads and a plurality of second outer leads formed to be spaced apart from each other so as to face each other in the outer lead region,
wherein at least some of the plurality of first outer leads are electrically connected to the second wiring pattern through the first via,
wherein the remaining of the plurality of first outer leads extend from the first wiring pattern to the outer lead region,
wherein the plurality of second outer leads are electrically connected to the second wiring pattern through the second via, and
wherein the plurality of the first outer leads are arranged closer to an inner lead region defined in the base film than the plurality of the second outer leads, and
wherein the plurality of first outer leads comprises:
third outer leads, which are electrically connected to a first wiring pattern that is formed on one surface of the base film; and
fourth outer leads, which are electrically connected to a second wiring pattern that is formed on the other surface of the base film.

12. The flexible circuit board of claim 11, wherein the number of the plurality of first outer leads is greater than the number of the plurality of second outer leads.

13. An electronic device, comprising:
a flexible circuit board; and
an external device bonded to the flexible circuit board,
wherein the flexible circuit board comprises:
a base film with an outer lead region defined on either one surface or the other surface; and
an outer lead formed in the outer lead region and connected to the external device,
wherein the outer lead comprises a plurality of first outer leads and a plurality of second outer leads formed to be spaced apart from each other so as to face each other in the outer lead region,
wherein the number of plurality of the first outer leads is greater than the number of the plurality of second outer leads, and
wherein the plurality of the first outer leads are arranged closer to an inner lead region defined in the base film than the plurality of the second outer leads, and
wherein the plurality of first outer leads comprises:
third outer leads, which are electrically connected to a first wiring pattern that is formed on one surface of the base film; and
fourth outer leads, which are electrically connected to a second wiring pattern that is formed on the other surface of the base film.

14. The electronic device of claim 13, wherein the external device comprises a flat panel display, and
wherein an area of a region in which a via is arranged in the outer lead region is formed to correspond to an area of a bezel of the flat panel display.

\* \* \* \* \*